United States Patent [19]

Leduc

[11] Patent Number: 5,485,033
[45] Date of Patent: Jan. 16, 1996

[54] LATERAL TRANSISTOR HAVING A PARTICULAR EMITTER STRUCTURE

[75] Inventor: Pierre Leduc, Coleville-Montgomery, France

[73] Assignee: U.S. Philips Corporation, New York, N.Y.

[21] Appl. No.: 450,428

[22] Filed: May 25, 1995

Related U.S. Application Data

[63] Continuation of Ser. No. 223,876, Apr. 19, 1994, abandoned.

[30] Foreign Application Priority Data

Apr. 7, 1993 [FR] France .................... 93 04137

[51] Int. Cl.⁶ .................... H01L 29/70; H01L 29/735
[52] U.S. Cl. .................... 257/578; 257/557; 257/591
[58] Field of Search .................... 257/591, 592, 257/593, 584, 786, 565, 578, 579, 580, 583, 557, 560, 561

[56] References Cited

U.S. PATENT DOCUMENTS

| | | | |
|---|---|---|---|
| 4,007,474 | 2/1977 | Yagi et al. | 257/591 |
| 4,032,957 | 6/1977 | Yagi et al. | 257/591 |
| 4,949,145 | 8/1990 | Yano et al. | 257/592 |
| 4,951,108 | 8/1990 | Leduc | 257/786 |

FOREIGN PATENT DOCUMENTS 0401354 of 0000 European Pat. Off. .

OTHER PUBLICATIONS

"Some Aspects of LEC Transistor Behavior" H. G. De Graaf et al, Solid State Electronics No. 19, pp. 809–814.
"The Physics and Modeling of Heavily Doped Emitters" Jesus A. Del Alamo et al, IEEE Transactions on Electron Devices, vol. ED–31, No. 12, Dec. 1984, pp. 1878–1888.

*Primary Examiner*—Rolf Hille
*Assistant Examiner*—Wael M. Fahmy
*Attorney, Agent, or Firm*—Steven R. Biren

[57] ABSTRACT

A semiconductor device including a vertical transistor, for example of the pnp type, having a p-type substrate (1) which forms the collector, with at its surface an epitaxial n-type layer (3) in which a p-type emitter region (15, 16) is formed, while the portion (9) of the epitaxial layer (3) lying between the emitter (15, 16) and the collector (1) forms the base. In this vertical transistor, the current gain is very strongly increased when the emitter is formed by a first partial emitter region which is weakly p-type doped and which extends below an insulating layer (6) and by a second partial emitter region (16) which is strongly $p^{++}$-type doped and which extends below the contact zone (26) of the emitter defined by an opening in the insulating layer (6). The respective thicknesses and doping levels of the first (15) and second (16) emitter regions are provided such that the first region is transparent to electrons and the second forms a screen against electrons. In addition, the ratio of the areas of the two partial regions (Sox/Sm) is higher than 2, while the area (Sm) of the second region (16) is chosen to be small. The various regions of the transistor are formed by very thin layers. The transistor may alternatively be of the npn type.

3 Claims, 2 Drawing Sheets

1

LATERAL TRANSISTOR HAVING A PARTICULAR EMITTER STRUCTURE

This is a continuation of application Ser. No. 08/223,876, filed on Apr. 6, 1994 now abandoned.

FIELD OF THE INVENTION

The invention relates to a semiconductor device comprising a vertical transistor which comprises:

a collector region and an emitter region, each of a first conductivity type, the emitter region adjoining a main surface of the semiconductor device;

an intermediate base region of a second conductivity type;

at least one electrical emitter contact zone for a metal contact pad for electrically contacting the emitter, delimited by an opening provided at the surface of the emitter region in an insulating layer disposed on said main surface, and in which transistor the ratio of the surface area of the emitter region situated below the insulating layer, called first partial emitter region, to the area of the emitter region situated below said electrical emitter contact zone, called second partial emitter region, is at least equal to 2.

The invention finds its application in all integrated circuits comprising vertical bipolar transistors in which an improved current gain is the object.

In the following description, the term "minority carriers" is to be understood to mean electrons when the region in question is of the p-type and holes when the region in question is of the n-type.

BACKGROUND OF THE INVENTION

A semiconductor device comprising a high-gain vertical transistor having the characteristics mentioned above is known from a prior-art document, i.e. the Patent EP 0 401 354. This Patent related to a vertical bipolar transistor with a collector region and at least one emitter region, for example of the p-type, adjoining the main surface of a circuit, and an intermediate region, in this case of the n-type. This transistor comprises at its surface an insulating layer in which at least one opening is formed for delimiting the effective electrical contact zone between the emitter region and the metal contact pad for contacting the emitter. The transistor has the characteristic that the emitter region has a constant thickness and a homogeneous doping level such that the diffusion length of the minority carriers injected vertically into this entire region is higher than or equal to the thickness of this emitter region. In addition, the ratio of the surface area of the emitter region to the surface area of the effective electrical contact zone of the emitter is chosen to be higher than or equal to 5, and preferably lies between 20 and 300.

Under these conditions, the known device provides a high current gain β such that:

β=150 if the ratio of the areas is between 5 and 7,

β=1620 (measured), and 1765 (calculated) when the ratio is 146.

This current gain asymptotically approaches a value which is almost reached when the ratio is equal to 300. This is why the above values of between 20 and 300 are preferred for this ratio.

In the realization of this known device, the effective emitter contact zone had a surface area of the order of 16 μm², which resulted in an emitter region area of 350 μm² for a ratio between the areas of 146. Such an emitter surface area meant that the known vertical transistor could not be included in integrated circuits with a high integration density (LSI or VLSI).

The doping of the emitter layer was of the order of $2\times10^{16}$ atoms.cm$^{-1}$ and the thickness of the emitter region was of the order of 0.8 μm.

The process of manufacturing the vertical transistor disclosed by this Patent EP 0 401 354 comprised the formation of a p-type silicon substrate, of an epitaxial n-type layer, and of an insulation island of $SiO_2$ for defining the transistor. At the center of the island, a p-type emitter region of 0.6 to 0.8 μm thickness was implanted into the epitaxial n-type layer while an interposed n-type layer was left for forming the base between the implanted p-type emitter region and the p-type substrate which forms the collector of the vertical transistor. Openings were provided in an $SiO_2$ upper insulating and protecting layer to render possible the manufacture of the various metal contact pads.

Another vertical bipolar transistor, also with a high gain, is known from a second prior-art document, the U.S. Pat. No. 4,007,474. This second document describes a semiconductor device with means for increasing the current gain of a vertical npn bipolar transistor. The emitter region of this transistor is formed by two partial regions: a first partial region of low conductivity ($n^-$) which has a surface area and a depth which are greater than those of a second partial region of high conductivity ($n^+$).

Here the thickness of the second $n^+$ partial region adjoining the surface of the device immediately below the electrical contact zone of the emitter pad is 1 μm, and its doping level with phosphorus in silicon is $10^{20}$ cm$^{-3}$.

The thickness of the first $n^-$ partial region considered between the second $n^+$ partial region and the base layer is between 2 and 5 μm, and its doping level with antimony in silicon is approximately $5.5\times10^{15}$ cm$^{-3}$.

The manufacturing process of the vertical transistor known from this second cited document comprises the formation of an n-type heavily doped substrate for forming the collector, on which an epitaxial layer also of the n-type is realized so as to be used as the collector in conjunction with the substrate, which epitaxial layer has a thickness of 20 μm.

The base layer of 3 μm thickness is realized through p-type diffusion into this epitaxial layer. The n-type emitter regions are formed at the surface with conductivities and thicknesses as given above.

Generally speaking, the transistor disclosed by this second cited document was realized in a technology which was still in use during the period around 1980, and it consisted in the use of layers of the order of 20 μm for realizing the transistors. In this technology, moreover, the emitter contact zone was of approximately the same surface area as the surface area of the emitter itself, and this surface area was preferably as large as possible so as to minimize the resistance.

The total thickness of the first and the second partial emitter regions, considered in vertical direction, is given as smaller than the diffusion length into the weakly doped partial region, and the thickness of the strongly doped region is much smaller than the thickness of the weakly doped region.

In this known device, the weakly doped region is realized by means of an $n^-$ epitaxial layer formed at the surface of a p-doped epitaxial layer which forms the base, all this at the surface of the collector. The strongly doped region is then realized through $n^+$ diffusion into the epitaxial $n^-$ layer such that it forms a very superficial layer which covers substantially the entire surface of the weakly n⁻ doped subjacent layer. In this manner the two emitter regions form a stack with a horizontal junction. It is taught that it is important for this horizontal junction between these two regions of strong and weak doping, written L-H, to be at least 4 µm away from the emitter-base junction in vertical direction.

The emitter structure, which is of the LEC (Low Emitter Concentration) type, is indeed of specific shape and dimensions.

Vertical transistors are important for realizing integrated circuits in which the designer wants to include inverting transistors as well as current source transistors. In this case the inverting transistors are mostly realized as lateral transistors, while the current source transistors are vertical transistors.

The current gain factors of vertical transistors are higher (50 to 100) than those of lateral transistors (<50). The first cited prior-art document teaches that the proposed vertical transistor renders it possible to achieve a current gain of the order of 150 to 1800, depending on the surface area ratios employed. The second cited prior-art document squarely states a current gain of the order of 10000 ($10^4$).

Numerous experiments have been carried out with the object of realizing the said vertical transistor proposed in the second cited document in order to obtain the very advantageous gain which seemed to be possible. This known transistor certainly proved to have a low noise level as described in the cited document.

Nevertheless, it should be taken into account that not only the emitter is weakly doped ($5.5\times10^5$ cm$^{-3}$) but also the base ($10^{16}$ cm$^{-3}$). This is the most important phenomenon in this second cited Patent. Experiments have in fact shown that, even if the strongly doped n$^{++}$ partial emitter region is not realized in this known device, the prospective gain of 10.000 ($10^4$) is still obtained. This is due to an error in the physical theory propounded in this patent. The strong gain indeed is not the result of the strongly doped layer but of the fact that the base layer and the main emitter layer are both weakly doped. The injection efficiency is increased by this. In actual fact, the general transistor theory applies to the transistor structure described in this second cited document and not the theory propounded in this document.

The gain increase is accordingly due to a measure (the weak doping of the base) which is not openly stated, but which produces an insurmountable disadvantage: the gain which is held out is in actual fact obtained only when the base and the emitter are simultaneously weakly doped, whether the strongly doped partial emitter region exists or not. This strongly doped region has no part in the results as regards the announced gain because the injection efficiency is not due to surface effects but to the total of the effective impurities in the emitter.

The result is that in most cases this transistor known from the second cited document cannot be used because it has a much too low breakdown voltage owing to the weak doping of the base and emitter regions. To support these conclusions, it is useful to read the publication by H. G. de Graaff and J. W. Slotboom in "Solid State Electronics" no. 19, p. 809, 1976, in which the various aspects of the behavior of transistors with weakly doped emitters (LEC) are described. Generally, in the field of transistors, those skilled in the art must take great care when highly promising results are announced in order to ensure that these results are actually obtained through the described means, and without fatal flaws.

As regards the high-gain transistor known from the first cited prior-art document, on the other hand, this device has the disadvantage that it is very bulky. In the present state of technology it is indeed mainly the object to increase considerably the integration density of active and passive elements on one and the same substrate. This condition is absolutely imperative in the semiconductor industry.

While the device known from the first cited document does not have an attractive gain performance, on the other hand its dimensions render it unsuitable for industrial development of circuits with a very high integration density.

Nevertheless, this known device according to the first prior-art citation (dating from 1988) marks a turning point in the technology of vertical bipolar transistors because its operation is based on surface effects which were completely unknown in the state of the art obtaining until that moment, and corresponds to completely novel theories which are in complete contradiction to the theories on which the previously used state of the art was based, as described in the second cited document (dating from 1977).

To understand the novel theory applied in this Patent EP 0 401 354 (first cited document), those skilled in the art may profitably read the publication with the title "The physics and modeling of heavily doped emitters" by Jesus A. del Alamo and Richard M. Swanson in IEEE Transactions on Electron Devices, vol. ED-31, no. 12, December 1984, pp. 1878–1888. The term "heavily doped emitters" should be understood to cover, at the time of the publication, emitters more strongly doped than so-called LEC transistors, i.e. doped to approximately $10^{18}$–$10^{20}$ cm$^{-3}$ for transistors with a thick emitter layer of between 2 and 10 µm. It is evident from this publication that the operation of strongly doped emitters of transistors having thick layers is governed by the transport and the recombination of the minority carriers, but that the mechanisms affecting the lifetime of the minority carriers in the silicon are extremely complex and should be the subject of extensive research. This publication also indicates that in many cases the experimental results are in contradiction to the model results. This results from the fact that, because of the complexity of the phenomena in question, the model formation cannot take into account all parameters. Only intensive research is capable of getting to the heart of the problem relating to the behavior and the recombination time of the minority carriers in the silicon in the emitters of the transistors.

Nevertheless, this publication establishes that this behavior depends on the doping and the thickness of the emitter layer. The device described in the Application EP 0 401 354 (first cited document) realizes a selected number of means which utilize this teaching from the cited IEEE publication for providing the vertical bipolar transistor structure having an improved gain as described. With the appearance of the new theory which has put into practice in this Patent EP 0 401 354, presenting an emitter with an area between 20 and 300 times larger than was usual in conventional devices and an extremely small contact zone area, those skilled in the art were thus obliged seriously to reconsider all which had been the basis of their previous general knowledge, with all the difficulties mentioned in the IEEE publication.

Until the day, therefore, it had been particularly difficult to improve the device described in the Patent 0 401 354 (first cited document); the more so since it was imperative for its industrial use in LSI (Large Scale Integration) circuits with a high integration density or (VLSI) (Very Large Scale Integration) circuits with a very high integration density to reduce its dimensions considerably while preserving the very valuable quality of a strongly increased gain.

It appears now that, far from helping those skilled in the art, new conditions imposed by the evolution of the technologies on the contrary have reinforced the difficulty of resolving this problem. These new conditions result from a recent technological breakthrough which consist in the realization of layers, epitaxial and implanted, with thicknesses which are approximately 2 to 10 times smaller than those obtained in the Patent Application EP 0 401 354 cited above, which leads to thicknesses of the epitaxial layer of the order of 1 μm, in which layer the emitter and base regions are formed with correspondingly small thicknesses. Owing to this evolution, it was found that the gain of the vertical transistors decreased as the thickness of the layers used was reduced. Thus the general insights of those skilled in the art were put into question again, and their experiences acquired in the understanding of the phenomena relating to transistor emitters had to be reconsidered on these new bases, because the old theories on transistors having thick layers were no longer directly applicable.

The device known from the second cited document (U.S. Pat. No. 4,007,474) is considered as not complying with the technological standards and performance requirements of today, and above all as incapable of modification, adaptation or further improvement for achieving those characteristics which are now necessary.

SUMMARY OF THE INVENTION

The technical problem, therefore, which is urgently to be solved now is how to realize a device with a vertical transistor which is compatible with the new technologies using very thin layers, which has a small surface area capable of integration on a large scale, and/or which provides an improved current gain compared with the cited prior art, which combination of conditions seems to be particularly contradictory, while the other properties of the device are not to be detracted from.

This technical problem is resolved by means of a device as defined in the opening paragraph which is in addition characterized in that:

the emitter and base regions are of the so-called thin or ultrathin type, the first partial emitter region has a first thickness h1 and a first level of conductivity of the first type obtained by a first doping level such that the diffusion length of the minority carriers injected vertically into this first partial region is greater than or equal to its thickness, the second partial emitter region has a second thickness h2 which is at least half the said first thickness h1 and a second conductivity level of the first type higher than the first level, this second level being obtained by a second doping level which is higher than the first doping level, while this second thickness and this second doping level are chosen such that this second partial region acts as a screen against the minority carriers.

This semiconductors device provides the advantage that the current gain of the vertical transistor is substantially higher, given equal dimensions, than that of the transistor known from the first cited document, or alternatively is equally high for smaller dimensions, which is achieved with a thin layer technology in accordance with the new objectives.

The device according to the invention may thus offer a better performance as regards current gain and/or may be integrated more readily on a large and very large scale (LSI, VLSI) with an equal gain.

The effect produced by the new technical means applied to the emitter of the transistor is the more effective as the layers forming the transistor are thinner. Not only does this effect render it possible to compensate fully for the disadvantageous effect produced on the gain by the use of the thin layer technology, but the gain is even increased more strongly as the layers are thinner.

BRIEF DESCRIPTION OF THE DRAWING

The invention will be described below in detail with reference to the annexed diagrammatic Figures, in which.

DESCRIPTION OF THE EMBODIMENTS

Figure 1A:
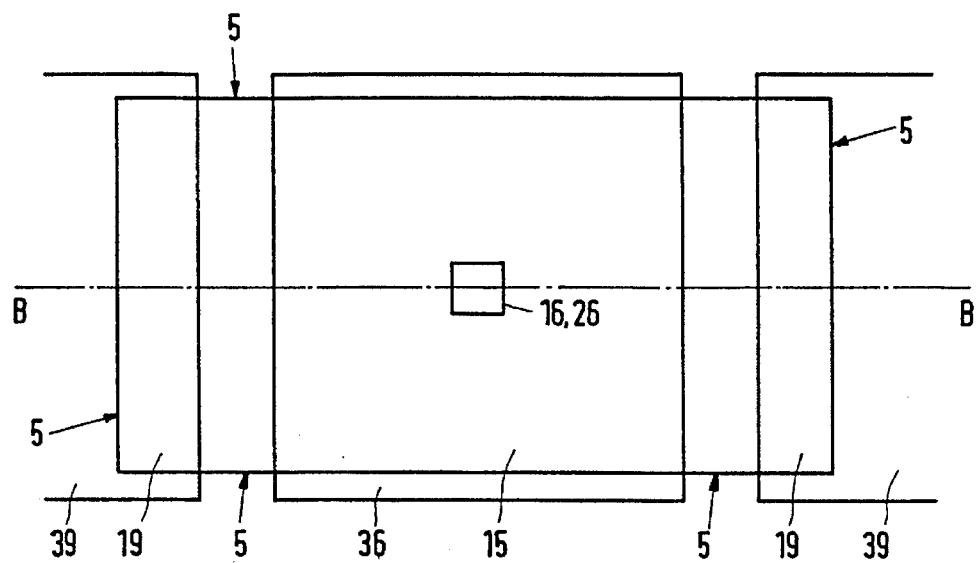
FIG. 1A shows in plan view a portion of a semiconductor device comprising a vertical bipolar transistor.
Figure 1B:
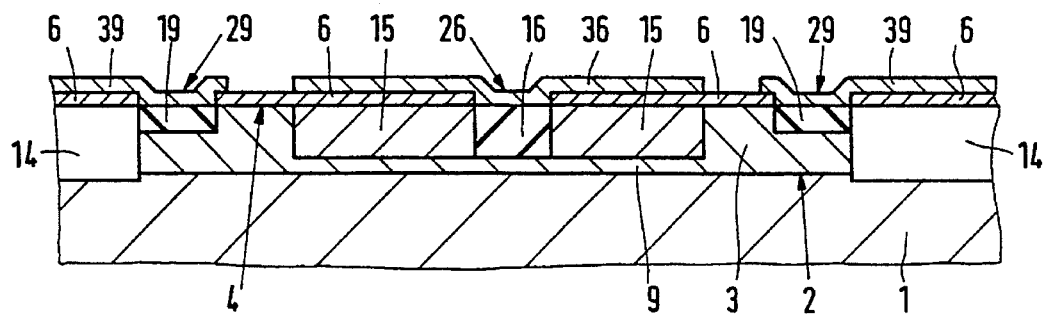
FIG. 1B is a cross-sectional view taken on the line B—B of the vertical bipolar transistor of FIG. 1A.

FIG. 1A is a diagrammatic plan view of a portion of an embodiment of a semiconductor device comprising a vertical bipolar pnp transistor according to the invention. FIG. 1B shows a cross-section taken on the line B—B of this portion of the device.

According to this embodiment as shown in FIG. 1, the device comprises a semiconductor body 1 or substrate, for example made of silicon (Si), of a first p-conductivity type, to whose surface 2 is applied an epitaxial semiconductor layer 3 of the opposed, n-conductivity type. This epitaxial layer 3 is subdivided into several portions, among which at least one island 5 of the second, n-conductivity type situated between insulation regions 14, which insulation regions 14 extend throughout the thickness of the epitaxial layer 3 from the upper surface 4 of this layer down to the substrate 1.

The island 5 comprises a vertical bipolar pnp transistor having a region 15, 16 of the first, p-type conductivity formed in the epitaxial layer 3, for example through implantation followed by diffusion, such that an n-type region 9 remains between the lower portion of the region 15, 16 of the first, p-type and the substrate 1 of the first, p-type. The epitaxial layer 3 is of the type called thin or ultrathin by those skilled in the art. Thickness values will be given further below by the way of example.

The regions 15, 16 form the emitter region, the region 9 forms the base, and the substrate 1 forms the collector of the vertical transistor.

An insulating layer 6 is realized for protecting the main surface 4 of the semiconductor device.

The emitter region is formed by two partial emitter regions. The first partial emitter region, called peripheral emitter region 15, has a thickness h1. An essential condition is imposed on the value of the thickness h1 and on the conductivity level, i.e. on the doping level of this first partial region 15: the thickness value h1 and the conductivity level must be such that the diffusion length of the minority carriers, in this case electrons, injected into this partial emitter region is greater than the said thickness h1. In other words, the first partial region 15 must be transparent to the injected minority carriers. This is achieved on the one hand by means of a small thickness h1 corresponding to an emitter region of the thin layer type which is nowadays used more and more by those skilled in the art in new integrated circuit technologies. On the other hand, this is achieved by means of such a first partial emitter region which is in addition medium-doped, i.e. of the first conductivity type with a first medium level, usually written by those skilled in the art as p or p$^+$. The doping levels will be given more precisely below when a manufacturing method is given by way of example.

The emitter region in addition comprises a second partial emitter region 16, called central emitter region, of a smaller surface area and with a thickness h2 which may have a value from half that of the first partial emitter region 15 to a value slightly greater than that, extending from the surface 4 of the implanted epitaxial layer towards the lower portion of the first partial emitter region 15. Generally, this second partial emitter region 16 extends over a thickness h2 which differs little from the thickness h1 of the first partial emitter region because these layers are in general ultrathin. Moreover, this second partial emitter region is of the first conductivity type, with a second level of this type of conductivity which is higher than the first level of the first partial region. Such a high level of the second type of conductivity is written p$^{++}$ by those skilled in the art and is obtained by means of a doping level of the second region which is at least twice that of the first region. The thickness h2 of the second region and the doping level thereof are chosen such that this second partial emitter region 16 acts as a screen against the minority carriers.

In the island 5, a collector region of the first conductivity type is provided, implanted into the epitaxial layer between the surface of the layer and the substrate and heavily p$^+$ doped so as to reduce the collector resistance. This collector region is provided with a collector contact pad at its surface, realized in an opening made in the insulating layer 6. This type of construction of the collector region is known to those skilled in the art and is accordingly not shown in the Figures for reasons of simplicity. As an alternative to this realization of the collector contact on the front or main surface of the circuit formed by the surface 4 of the epitaxial layer, those skilled in the art may realize the collector contact on the rear surface of the substrate.

The base region 9 is disposed below the emitter regions 15, 16 between these emitter regions and the substrate 1, thus forming a vertical collector-base-emitter stack. This base region 9 is of the second conductivity type and has a medium doping level n sufficient for avoiding the disadvantages inherent in the device known according to the prior art (LEC transistor).

The base region 9 laterally bounds the emitter region 15. In the lateral extension of this base region 9, a base region 19 is provided which lies against the surface 4 of the epitaxial layer 3. This base region 19 is of the second conductivity type at a second, high doping level n$^{++}$ for reducing the base resistance. An opening defining the base contact zone 29 is provided in the insulating layer 6 down to the surface of the region 19. A base contact pad 39 is realized partly on this insulating layer 6 and partly in the base contact zone 29.

The combination of the two partial emitter regions 15, 16 with the characteristics described above is essential for achieving the aims of the invention.

An opening defining the emitter contact zone 26 is provided in the insulating layer 6 down to the surface of the emitter region. An emitter contact pad 36 is realized partly on this insulating layer 6 and partly in the contact zone 26.

According to the invention, the electrical contact zone 26 of the emitter has a small surface area compared with the area of the first partial emitter region 15, and has substantially the same surface area as the second, central partial emitter region 16. The ratio of the area of the first partial emitter region 15 to the area of the emitter contact zone 26 is high than 2. The contact zone 26 is that zone in which the contact pad 36 is in actual contact with the emitter region.

According to the second prior art cited, such as emitter contact pad was realized in such manner that the contact zone occupied the major part of the surface area of the two stacked emitter regions in order to minimize the emitter resistance. Moreover, it was desirable for the total surface of the stacked emitter regions to be small.

According to the invention, it was demonstrated that in a vertical transistor whose emitter is such that the diffusion length of the minority carriers injected vertically therein is greater than or equal to the emitter thickness, the criteria according to the prior art relating to a maximum contact surface area on an emitter region area of minimum dimensions are not longer optimal.

An experimental study designed to verify certain theoretical hypotheses relating to the properties of carrier injection into the emitter have made it possible to arrive at a simplified injection model which is explained below which reference to FIG. 2.

Figure 2:
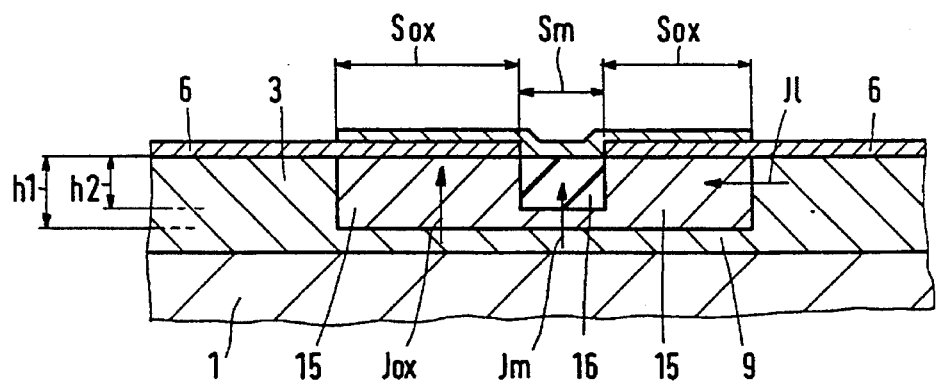
FIG. 2 is a symbolic representation of the current densities in the various portions of the emitter region, viewed in a diagrammatic cross-section of an emitter region of a vertical bipolar transistor.

FIG. 2 diagrammatically shows a peripheral emitter region 5 of the p or p$^+$ type realized in an n-type layer 3 which forms the base region. A protective insulating layer 6 is provided at the surface of this device and has an opening 26 for an emitter contact pad 36. The contact pad 36 is in actual contact with the emitter region 16 only within the opening 26 with a surface area Sm. The area of the peripheral layer 15 formed by the total surface area of the emitter region with the exception of the area 26 below the emitter contact, is written Sox by contrast. The area of the second, central partial region 16 is substantially equal to the area of the emitter contact zone 26.

The first partial emitter region 15 has a first thickness h1 and a first doping level such that the diffusion length of the minority carriers injected vertically therein is greater than or equal to the first thickness h1. The minority carriers in this p-type layer are electrons which travel towards the surface 4 of the emitter layer. The holes move in the opposite direction.

If the vertical transistor is of the npn type instead of the pnp type, as in the example described, then the minority carriers will be holes instead of electrons, but the operation of the transistor is subject to the same theoretical laws, and the word "electrons" may be simply replaced by "holes" in the description.

The lateral injection current density of the minority carriers into the base is referenced Jl, the vertical injection current density of the minority carriers below the emitter contact zone 16 is referenced Jm, and the vertical injection current density of the minority carriers below the portion of the insulating layer 6 which covers the peripheral emitter region 15 is referenced Jox. The lateral density Jl is considered negligible in a vertical transistor. The injection current densities are indicated with arrows in FIG. 2.

The theory and experience have shown that the current gain $H_{FE}$ could be expressed in a first approximation as:

$$H_{FE}=K/(Jm.Sm+Jox.Sox)$$

in which K is a constant for a vertical transistor.

According to the invention, the current gain $H_{Fe}$ is increased by a reduction in the quantity Sm, by an increase in the quantity Sox, and by a further reduction of the term JmSm through reduction of the current density term Jm.

This effect is obtained when:

the ratio of the area Sox of the peripheral emitter region 15 to the area Sm of the emitter contact zone 26 is of the order of or greater than 2;

a second partial emitter region 16 exists and has an area Sm substantially defined by the emitter contact zone 26;

the second partial region 16 is a region which has a second conductivity level higher than the first conductivity level of the superficial partial region 15, written $p^{++}$, with a thickness h2 sufficient for this second region 16 to act as a screen against the minority carriers.

The new value of the current density Jm below the contact, in the region 16, is smaller by a factor of approximately 3 than the current density value which is obtained when the region 16 is not doped more strongly than is the region 15.

The current gain is now substantially solely the result of the vertical injection caused by the injection below the insulating layer, which injection in its turn is the result of the injection below the emitter contact zone 26.

In FIG. 1A, the comparatively large surface area of the first emitter region 15, in conjunction with the fact that an emitter contact zone 26 has a limited surface area, renders it possible to profit fully from this phenomenon of injection below the insulating layer, which utilizes surface effects of the active impurities and which used to be regarded in the prior art as a mainly undesirable phenomenon. According to the invention, with the realization of the peripheral emitter region 15 of medium doping and with the realization of the central emitter region 16 with strong doping and with a surface area limited to that of the contact zone 26, the active roles of these regions have been differentiated and the operation of the vertical transistor has been optimized.

The theory relating to the increase in gain in a transistor according to the invention takes into account the technical aspects described below for the example of a pnp transistor. The recombination rate of the minority carriers and their diffusion length should be taken into account simultaneously.

To increase the current gain of the transistor, according to the invention, the hole currents are preferred and reinforced relative to the electron currents in the vertical direction. This choice renders it possible to minimize the electron-hole recombination rate. This theory is in agreement with the theory of the injection efficiency described in the IEEE publication cited above.

The diffusion length of a minority carrier is defined as the mean distance travelled by a minority carrier in a given material before it recombines.

The recombination rate is defined as the number of recombinations which take place in a given volume per unit time. The recombination rate is a constant whose value depends on the geometry of the material, i.e. its thickness and its doping level.

Below the metal emitter contact in the lateral transistor known according to the prior art, the recombination rate is very high owing to the fact that the material is quasi-metallic and the electron current is always very strong. According to the invention, accordingly, an emitter contact zone of very small surface area Sm is opted for so as to minimize the electron current, while at the same time a strongly doped partial region 16 is realized.

The recombination rate is low below the insulating layer. In addition, the doping and thickness are chosen such that the diffusion length is greater than the thickness h1 of the peripheral emitter region. Thus, by choosing a large area Sox, the current of holes in this region is promoted. This result is obtained with a p-type doping which is comparatively weak and a thickness h1 which is small. This is one of the reasons why the technology which uses transistors with thin layers is favorable for the invention.

It hollows from the theory based on the injection efficiency that in proportion as the central layer 16 is doped more strongly relative to the peripheral emitter layer 15, the current of holes is increased relative to the current of electrons. The result of this is that the strongly doped central layer 16 is not a supplementary means for reducing the electron-hole recombinations, but that this strongly doped central layer 16 will cooperate with the weakly doped peripheral layer 15 in reinforcing the current of holes in relation to the current of electrons.

In fact, when the difference in doping level between the regions 15 and 16 is increased, an abrupt profile of impurities is created between the two regions 15 and 16. A field which repels minority carriers, here electrons, is created at the slope of the doping profile, and holes are favored thereby.

Owing to the existence of the highly doped central region 16, it is also favorable that the layers are thin, i.e. that the distance between the bottom of the highly doped region 16 (see FIG. 2) and the substrate is very small. Nevertheless, in the present case of ultrathin layers, and in view of the dimensions present, the possibility of realizing layers 15 and 16 with different thicknesses is dependent on available technical means and it is in fact not disadvantageous for obtaining the envisaged gain improvement if said layers 15 and 16 should have the same thickness h1=h2. With this type of structure with ultrathin layers, the gain in fact increases when the concentration ratio between the total of p-type charges and the total of n-type charges increases. This ratio increases the more strongly as a substantially constant emitter thickness h1, h2 is maintained, while the thickness of the epitaxial layer is decreased, which decreases the thickness of the n-type layer and thus the total number of n-type charges. According to the invention, therefore, the use of structures with ultrathin layers is an advantage and not a disadvantage for the gain. Nevertheless, if h2 were to become greater than h1, then the emitter-base capacitance would increase.

In practice, the current gain is limited by the emitter resistance which, in the case of FIG. 1A, is governed by the dimensions of the emitter contact zone 26.

It is therefore necessary to choose dimensions for the emitter contact zone 26 such that a high gain is reconciled with an acceptable emitter resistance.

To obtain a vertical transistor having a high current, it is possible to realize a structure of square shape as shown in FIG. 1A. In this structure, the base region 19 and the collector region (now shown) may form, for example, concentric rings which are connected to a base contact and a collector contact, respectively, by contact zones corresponding to openings in the protective insulating layer 6.

Figure 3:
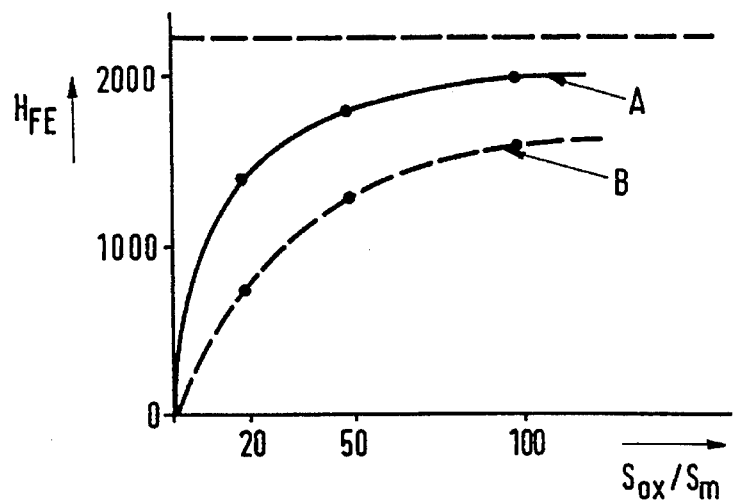
FIG. 3 shows comparative curves of the current gain $H_{FE}$ as a function of the ratio between the emitter areas below the insulating layer Sox and below the electrical contact zone Sm.

FIG. 3 shows curves indicating the current gain $H_{FE}$ as a function of the Sox/Sm ratio. The gain $H_{FE}$ is defined as the ratio of the collector current to the base current IC/IB, the transistors having the characteristics as recommended in the manufacturing process described below by way of example. Full curve A relates to a vertical transistor with a $p^{++}$ strongly doped central partial emitter region 16, differentiated from a less strongly doped peripheral emitter region 15. Broken curve B relates to a "comparison transistor" in which this region 16 is not differentiated from the peripheral region 15, so having these two regions 15 and 16 will the same doping level p or p⁺.

The gain in A is higher. This gain, moreover is the more increased as the Sox/Sm ratio increases.

A vertical transistor having a structure according to the invention shows a gain $H_{FE}$ which tends towards a maximum of the order of 2200.

As follows from a comparative study of the curves A and B in FIG. 3, the transistor according to the invention renders it possible to obtain the same gain as the comparison transistor under center conditions. These conditions, however, are such that the transistor according to the invention renders it necessary to take an area Sox much less large than in the comparison transistor in order to obtain this gain. To obtain a gain $H_{FE}$ equal to 1000, for example, with the transistor according to the invention, the value (Sox/Sm)=5, whereas with the comparison transistor this is (Sox/Sm)=30.

In other words, given the same ratio, i.e. the same surface area, the transistor according to the invention has a much higher gain. Given a ratio (Sox/Sm)= 5, for example, which corresponds to a small surface area occupation, the transistor according to the invention has a gain $H_{FE}$=1000, whereas the comparison transistor reaches no more than 300.

With the transistor according to the invention and an area ratio (Sox/Sm) equal to no more than 2, accordingly, the gain factor of 300 is obtained.

This is achieved, moreover, without any secondary negative effect on the breakdown voltage.

The transistor according to the invention therefore represents a considerable step forward compared with the prior art.

The transistor described is of the vertical pnp type, but it may equally well be of the npn type having any npn structure generally known to those skilled in the art. In such a vertical npn transistor, the two partial emitter regions are of the n-type with medium conductivity levels for the peripheral region and strong conductivity levels for the central region, as indicated above. The surface area ratio Sox/Sm is again the same.

A description will be given below, by way of non-limitative example, of a manufacturing process for the device shown in FIGS. 1A and 1B.

In a portion of a surface 2 of a p-type silicon substrate 1 of approximately 120 μm thickness which was a doping level of approximately $5\times10^{15}$ cm⁻³ and a resistivity of approximately 3 Ω.cm, an n-type silicon epitaxial layer 3 is provided in usual fashion, with a thickness which may be below 1 μm, or alternatively may be up to 2 μm, having a doping level of approximately $2\times10^{16}$ cm⁻³ and a resistivity of the order of 0.3 Ω.cm. An epitaxial layer having a thickness in the range indicated is considered thin or ultrathin by those skilled in the art. The epitaxial layer 3 forms the base region. The epitaxial layer in the transistor for which the gain curves are given in FIG. 3 had a thickness of 1.25 μm.

The epitaxial layer 3 may be made n-type through doping with arsenic (As).

The separating zones 14 may be realized by means of silicon oxide (SiO₂), "deep oxide"]insulating islands.

The peripheral partial emitter region 15 may be realized at the center of the base region through implantation and subsequent diffusion of an impurity such as boron (B) which provides the p-type conductivity, by means of a mask having an opening of large surface area. In the example described, the maximum doping level is of the order of $5\times10^{18}$ cm⁻³, the thickness h1 of the order of 0.7 μm, and the square resistance of the order of 500 Ω. With these values, the first partial emitter region is transparent to the minority carriers.

The second, central partial emitter region 16 may then be realized through implantation and subsequent diffusion of an impurity such as boron (B) providing the p⁺⁺ conductivity by means of a mask having a small opening, with a doping level higher than that of the previous diffusion, the doping level in this example being at most $2\times10^{19}$ cm⁻³; and to a thickness h2 which in this example is smaller than the thickness h1 of the peripheral region. For example, h2=0.4 μm. In other embodiments, however, it is possible to realize h2 to be up to 0.8 μm, while all other thicknesses remain unchanged. The square resistance in this example is of the order of 120 Ω. With these values, the second partial emitter region 16 acts as a screen against the minority carriers.

Generally, the thickness h2 of the central emitter region remains within a range between half the value h1 and very slightly higher than the value of h1. The implantation depth of the emitter region is controlled so as to maintain the desired thickness of the base region 9 between emitter and collector. Given the thickness chosen for the epitaxial layer 3, the thickness h1 and h2 are also considered thin or ultrathin.

The ratio of the doping level of the central emitter region to the doping level of the peripheral region remains within a range from 2 to 10, the doping level of the peripheral region 15 being associated with the thickness h1 such that the diffusion length of the minority carriers is greater than h1, while that of the central region is chosen so as to form the desired screen against the minority carriers in conjunction with the thickness h2.

A protective layer 6, for example made of silicon oxide (SiO₂) or silicon nitride (Si₃N₄) is realized at the surface of the device thus assembled, with openings in the surface over zones envisaged for the contacts.

Figure 4A:
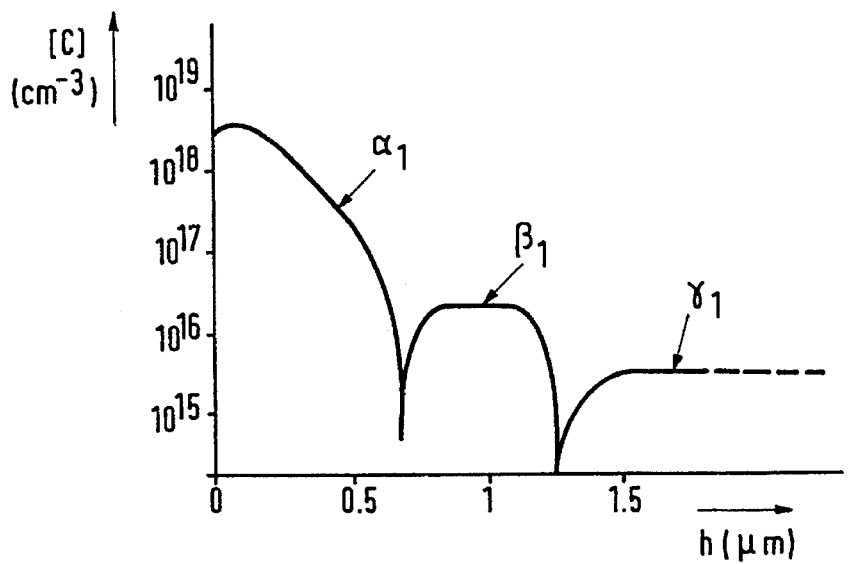
FIGS. 4A and 4B show curves depicting doping levels as a function of depth, starting from the surface of the emitter region, below the insulating layer in FIG. 4A and below the electrical contact zone in FIG. 4B.
Figure 4B:
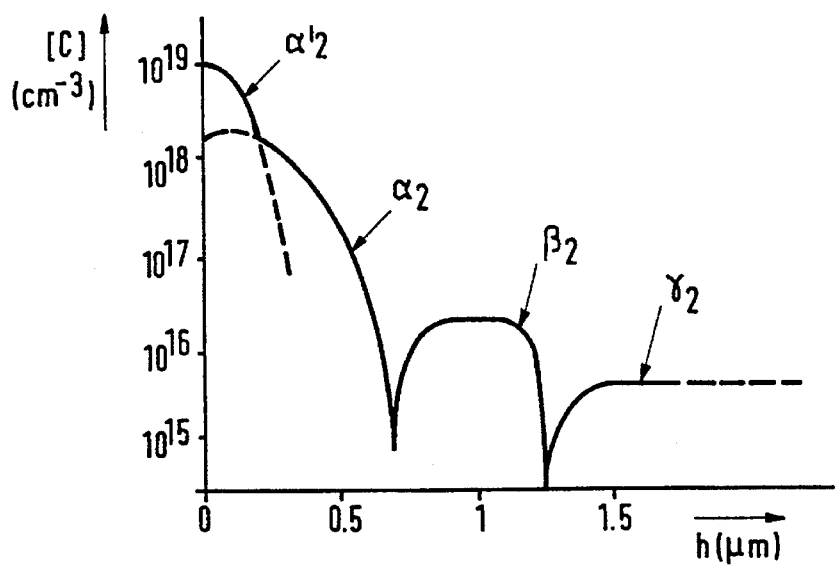

FIGS. 4A and 4B show the doping profiles of the various regions starting from the surface 4 of the lateral transistor towards the substrate 1, in conformity with the manufacturing process described above.

FIG. 4A shows the doping level C as the number of impurities per cm³ on the ordinate as a function of the depth h in μm plotted on the abscissa, in vertical cross-section through the peripheral region 16 of the emitter below the oxide (insulating layer 6).

The portion α1 corresponds to the doping level of the p⁺⁺ type ($10^{19}$ cm⁻³) in the peripheral emitter region 16 below the oxide over a thickness of 0.7 μm, the portion β1 corresponds to the n-type doping level ($2\times10^{16}$ cm⁻³) of the base below the emitter in the epitaxial layer 3 situated between 0.7 and 1.25 μm, and the portion γ1 corresponds to the p-type doping level of the substrate 1 ($5\times10^{15}$ cm⁻³).

FIG. 4B shows the doping level C as the number of impurities per cm³ on the ordinate as a function of the depth h in μm on the abscissa in a vertical cross-section through the central emitter region 16 below metal (contact zone 26).

The portion α'2 corresponds to the p⁺⁺ type doping ($10^{19}$ cm⁻³) in the emitter region 16 situated immediately below the metal 36 over a thickness of 0.4 μm; the portion α2 corresponds to the p⁺-type doping level below the emitter portion 16 between 0.4 and 0.7 μm, the portion β2 corresponds to the n-type doping ($2\times10^{16}$ cm⁻³) of the base below the emitter in the epitaxial layer 3 between 0.7 and 1.25 μm, and the portion γ2 corresponds to the p-type doping of the substrate 1 ($5\times10^{15}$ cm⁻³).

These curves have been drawn for a thickness of the epitaxial layer 3 of 1.25 μm.

I claim:

1. A semiconductor device including a vertical transistor comprising:

a collector region (1) and an emitter region (15,16), each of a first conductivity type, the emitter region (15,16) adjoining a main surface (4) of the semiconductor device;

an intermediate base region (9) of a second conductivity tape;

an insulating layer (6) disposed on said main surface (4) of the semiconductor device;

at least one metal electrical emitter contact pad zone (26) delimited by an opening provided in said insulating layer (4) at a substantially centered location on the surface of the emitter region, for electrically contacting said emitter region (15,16) in said opening; wherein the emitter (15,16) and base (9) regions have a total combined thickness of less than 2 μm;

the ratio of the surface area (Sox) of the emitter region situated below the insulating layer (6) and called a first partial region (15), to the surface area (Sm) of the emitter region situated below said emitter metal contact pad zone (26) and called a second partial emitter region (16) is between 2 and 100;

the first partial emitter region (15) below the insulating layer has a first level of conductivity of the first type obtained by a first doping level at least equal to or greater than $5 \times 10^{18}$ atoms/cm$^3$ and a first thickness h1 less than or equal to the diffusion length of the minority carriers in said first partial region, such that said first partial region (15) is transparent to the minority carriers which are injected vertically; and the second partial emitter region (16) is centered in the first partial emitter region below the emitter metal contact pad zone (26) and has a second level of conductivity of the first type obtained by a second doping level which is 2 to 10 times the doping level of said first partial emitter region and has a second thickness h2 substantially equal to said first thickness h1, such that said second partial region forms a screen against the minority carriers.

2. A device as claimed in claim 1, characterized in that the ratio of the area (Sox) of the first partial emitter region (15) to the area (Sm) of the second partial emitter region (16) lies between 2 and 10.

3. A device as claimed in claim 1, characterized in that the ratio of the doping level of the second partial emitter region (16) to the doping level of the first partial emitter region (15) is at least equal to 2.

* * * * *